United States Patent [19]

Fister et al.

[11] 4,441,118
[45] Apr. 3, 1984

[54] COMPOSITE COPPER NICKEL ALLOYS WITH IMPROVED SOLDERABILITY SHELF LIFE

[75] Inventors: Julius C. Fister, Hamden; John F. Breedis, Trumbull, both of Conn.

[73] Assignee: Olin Corporation, New Haven, Conn.

[21] Appl. No.: 457,606

[22] Filed: Jan. 13, 1983

[51] Int. Cl.³ .................. H01L 23/48; H01L 29/46; H01L 29/54; H01L 29/62
[52] U.S. Cl. .................. 357/70; 174/52 FP; 174/126 CP; 357/67; 428/643; 428/675; 428/929
[58] Field of Search ............... 428/643, 647, 674, 675, 428/929, 596, 601; 200/267, 268; 174/52 FP, 126 SP, 128 R; 357/70, 67 R; 420/481, 485

[56] References Cited

U.S. PATENT DOCUMENTS

| | | | |
|---|---|---|---|
| 2,849,310 | 8/1958 | Waller | 428/481 |
| 3,006,067 | 10/1961 | Anderson et al. | 228/193 |
| 3,097,965 | 7/1963 | Wilkins | 428/621 |
| 3,162,512 | 12/1964 | Robinson | 428/670 |
| 3,482,303 | 12/1969 | Trost | 428/643 |
| 3,490,125 | 1/1970 | Frieling, Jr. | 174/128 R |
| 3,808,034 | 4/1974 | Schreiner et al. | 427/360 |
| 3,892,637 | 7/1975 | Polti | 428/647 |
| 3,999,955 | 12/1976 | Martin et al. | 428/647 |
| 4,014,660 | 3/1977 | Schreiner et al. | 428/646 |

FOREIGN PATENT DOCUMENTS 56-96045  8/1981  Japan .................. 420/481

OTHER PUBLICATIONS

LaQue, F. L., "Galvanic Behavior of Tin Dipped Coatings on Copper Alloys", Corrosion, vol. 8, No. 4, Apr. 1952, p. 1.
Unsworth, D. A. et al., "A Preliminary Report on Growth of Compound Layers on Various Metal Bases Plated With Tin and its Alloys", Transactions of the Institute of Metal Finishing, Summer, 1973, pp. 85–90.
Cubberly, W. H. et al; Metals Handbook, vol. 2, 9th edition, pp. 619–621.

Primary Examiner—Michael L. Lewis
Attorney, Agent, or Firm—Barry L. Kelmachter; Paul Weinstein; Howard M. Cohn

[57] ABSTRACT

A composite structure having improved solderability shelf life and contact resistance is formed by coating a copper alloy substrate material with a tin-containing material. The copper alloy substrate material consists essentially of about 15% to about 30% nickel and the balance essentially copper. The copper alloy may further include up to about 25% zinc. The nickel in the alloy retards the growth of copper-tin and/or copper-zinc-tin intermetallic compounds and the diffusion of the copper through the coating. The coating may be formed from tin or tin alloys including tin solders, e.g. 60% Tin-40% lead solder.

15 Claims, 5 Drawing Figures

COMPOSITE COPPER NICKEL ALLOYS WITH IMPROVED SOLDERABILITY SHELF LIFE

The present invention relates to copper base alloys that have improved solderability shelf life.

Numerous types of coatings have been used on copper and copper alloys to prevent tarnishing, improve solderability and corrosion resistance, and reduce contact resistance between mating parts. In applications such as precision electrical switchgear and electronic components, precious metal coatings have been used to maintain good solderability and low contact resistance both in service and during prolonged periods of storage. Gold and gold over a metal layer such as nickel, silver, palladium, rhodium, ruthenium or platinum have been used as precious metal coatings. The metal layer typically acts as a diffusion barrier between the gold and the underlying substrate. Such a precious metal coating system is illustrated in U.S. Pat. No. 3,162,512 to Robinson.

Economic considerations as well as plating difficulties with precious metal coatings have encouraged the use of tin and tin alloys as coating materials. Industrial experience has shown that good protection and improved solderability is offered by such tin coatings. U.S. Pat. Nos. 3,006,067 to Anderson et al., 3,097,965 to Wilkins and 3,892,637 to Polti and the article "Galvanic Behavior of Tin Dipped Coatings on Copper Alloys" by F. L. LaQue, Corrosion, Vol. 8, No. 4, April, 1952, p. 1 illustrate some of the environments in which copper and copper alloys coated with tin and tin alloy coatings are used.

While good solderability on as-tinned metal is highly desirable, it is also desirable that the solderability be maintained for an indefinite period of time for those applications where solder repairs may be required after the initial installation. Numerous factors may cause degradation of the solderability of tinned materials. The most notable of these factors appears to be the interdiffusion of coating and substrate metals which eventually exposes the substrate elements to the environment. The interaction of the substrate elements with the environment often results in the formation of sulfides, oxides and carbonates which are not soluble in many of the milder or non-aggressive fluxes in use today. Consequently, the solderability degrades and the contact resistance increases to unacceptable levels. The article "A Preliminary Report on Growth of Compound Layers on Various Metal Bases Plated with Tin and Its Alloys", by D. A. Unsworth et al., Transactions of the Institute of Metal Finishing, Summer, 1973, pp. 85–90 further discusses this problem.

In copper and copper alloys coated with tin or a tin-containing material such as tin-lead solder, undesirable copper-tin intermetallic compounds often are formed. These intermetallic compounds form at the boundary between the copper and the tin-containing coating and grow through the coating. These intermetallic compounds form even at room temperature. When a tin-coated copper or copper alloy member is subjected to heat, the rate of copper-tin intermetallic compound formation tends to increase rapidly. To retard the formation of these intermetallic compounds, an intermediate layer of some suitable material is placed between the copper or copper alloy substrate and the tin coating. This intermediate layer acts as a diffusion barrier between the substrate and the coating. Silver plating or striping, nickel plating, and coatings of tin-bismuth or tin-nickel alloys have been used for the intermediate layer. U.S. Pat. No. 4,014,660 to Schreiner et al. illustrates the use of tin-bismuth or tin-nickel coatings.

While the use of such intermediate layers can be effective in reducing the formation of intermetallic compounds, their application is costly. In addition, if the intermediate layer is too porous, the rate of intermetallic compound formation may actually be accelerated rather than retarded. Therefore, it becomes desirable to eliminate the need for such an intermediate layer.

It is an object of the present invention to provide alloys of copper which when coated with tin or a tin-containing material exhibit reduced formation of undesirable copper-tin intermetallic compounds.

It is a further object of the present invention to provide copper alloys as above which when coated with tin or a tin-containing material exhibit improved solderability shelf life and reduced contact resistance.

It is a further object of the present invention to provide copper alloys as above which may be used in a wide variety of electrical and mechanical applications.

In accordance with the instant invention, copper alloys are disclosed to which a tin or tin-containing coating may be directly applied with reduced levels of copper-tin intermetallic compounds being formed. The copper alloys used in accordance with the present invention consist essentially of about 15% to about 30% nickel and the balance essentially copper. They are particularly useful as a substrate material for a tin-coated composite.

While cupronickel alloys having nickel contents up to 30% are commercially available, it has not been recognized previously that when coated with either tin or a tin-containing material, these alloys exhibit a decreased copper-tin intermetallic compound growth rate. As a result of this decreased growth rate, members formed from such a copper alloy and coated with tin or a tin-containing material have improved solderability shelf life and low contact resistance as well as other desirable properties.

It has been discovered that particularly good results may be obtained when the substrate comprises a copper alloy containing from about 15% to about 28% nickel. In a preferred embodiment, the substrate is formed from a copper alloy consisting essentially of about 19% to about 26% nickel and the balance essentially copper. If desired, the copper alloy may contain one or more additional elements. For example, it may further include up to about 25% zinc.

The tin coating applied to the copper alloy substrate may comprise pure tin, tin alloys including tin solders such as tin-lead solder and tin-antimony solder, or any other suitable tin-containing material. The coating may be applied in any suitable manner such as hot-dip tinning, electroplating, electrotinning, electroless plating or vapor deposition. The coating may cover the entire surface of the substrate or just that portion where a joint to another member is to be effected.

Composites or tin-coated members formed in accordance with the instant invention have been found to have a wide range of applications. They are particularly useful in environments where one member is to be soldered to another member. For example, they may be used for electrical components such as lead frames and electrical connectors that are to be soldered to another member. They also may be used for mechanical applications such as tin-coated tubing and plumbing fixtures.

When used for tubing or plumbing fixtures, composites having a substrate formed from the copper alloys described herein exhibit excellent corrosion resistance characteristics.

Still further features, objects, advantages and applications will become apparent from the following description and drawings.

Figure 1:
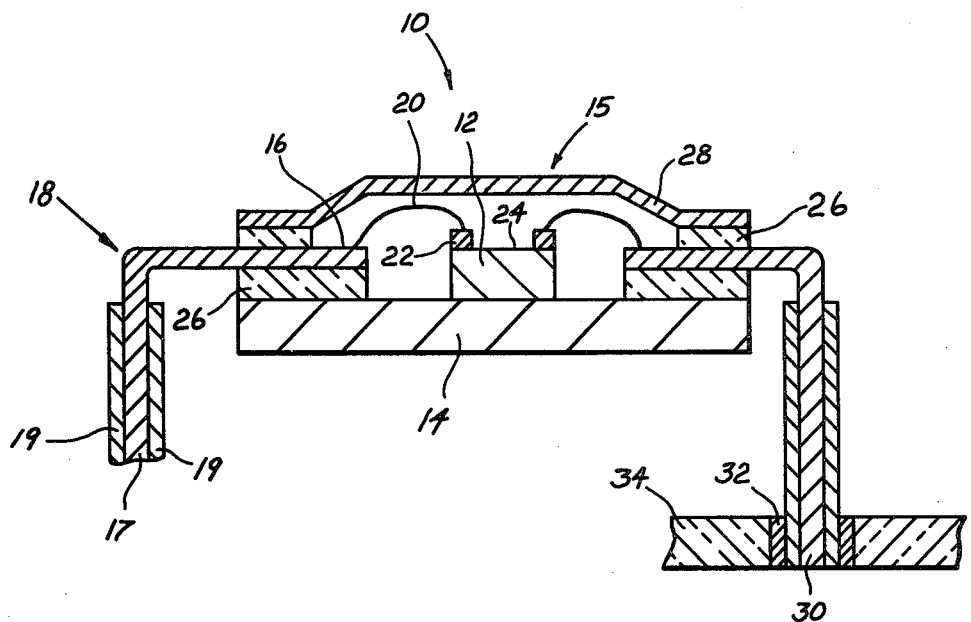
FIG. 1 is a sectional view of an integrated circuit assembly.

In many applications where an article is to be joined to another article by soldering, it is a well-known expedient to coat the article with tin or a tin alloy as an aid to making soldered connections. Thus, for example, tin-coated copper and copper base alloy electrical conductor wires and lead frames are standard articles of manufacture. However, as previously discussed, a copper-tin phase will form at the boundary between a copper or copper alloy substrate and a tin or tin alloy coating. In addition, solderability decreases and contact resistance increases as substrate elements become exposed to the environment.

The instant invention is based upon the recognition that copper base alloys containing greater than about 15% nickel exhibit reduced levels of copper-tin intermetallic compounds when coated with tin or a tin-containing material. The copper alloys used in the instant invention consist essentially of from about 15% to about 30% nickel and the balance essentially copper. It is believed that a nickel addition in the aforementioned range retards the growth of copper-tin intermetallics and slows the diffusion of copper through the coating to the surface. As a result, solderability shelf life and contact resistance are both improved. The copper alloys described herein are particularly useful as substrate materials where such properties as strength, corrosion resistance and electrical conductivity are desired.

It has been found that particularly good results may be obtained when the member to be coated with a tin-containing material is formed from an alloy consisting essentially of about 15% to about 28% nickel and the balance essentially copper. In a preferred embodiment, the copper base alloy consists essentially of about 19% to about 26% nickel and the balance essentially copper.

One or more additional elements may be present in the copper alloys described herein provided they do not interfere with the role of the nickel addition and do not adversely affect other desirable properties. The elements which may be added include zinc, manganese, iron, chromium, magnesium, phosphorous and molybdenum. These elements may be present in the following levels: up to about 25% zinc; up to about 6% manganese; up to about 1% iron; up to about 0.025% magnesium; up to about 0.025% phosphorous; up to about 3% chromium; and up to about 2% molybdenum. As used herein, the percentages described are weight percentages.

The nickel containing copper base alloys described herein may be cast in any convenient manner. The particular method of casting is not especially critical and any suitable method such as direct chill or continuous casting may be employed. After casting, the alloys may be processed in accordance with any suitable processing schedule. The processing used would depend upon the properties to be imparted to the alloy and its intended use. For example, the nickel containing copper alloy may be hot rolled using any suitable starting temperature. Following hot rolling, the alloy may be cold rolled to a desired final gage in one or more steps with or without at least one intermediate anneal. After being processed to final gage, the alloy may be subjected to a suitable heat treatment for providing it with a desired temper. The various processing steps may be performed in any convenient manner known in the art.

The nickel containing copper base alloys may be processed into any desired member or substrate to be coated having any desired form. For example, the member or substrate may be in strip, wire, rod, bar or tube form.

The member or substrate may be coated with any suitable tin-containing material. For example, the coating material may be tin, tin alloys including tin solders, such as tin-lead solder, e.g. 60% tin-40% lead, and tin-antimony solder, or any other suitable tin-containing material. The material selected for the coating would depend upon the ultimate use for the coated article.

The coating may be applied using any suitable coating technique known in the art. For example, the coating may be applied by hot-dip tinning, electro-tinning, electroplating, electroless plating or vapor deposition. If desired, the tin or tin alloy coating may be bonded to the substrate in an appropriate manner such as by an adhesive. U.S. Pat. No. 3,808,034 to Schreiner et al., which is hereby incorporated by reference, shows a suitable system for hot tin plating a copper base alloy member. The coating may either completely or partially cover one or more surfaces of the substrate member. For example, the coating may be a stripe plated on a portion of one surface of the substrate. Alternatively, the substrate may be completely surrounded by a coating.

Prior to coating, the substrate member may be passed through a suitable cleaning system for degreasing the substrate material and removing any contaminants. Any suitable cleaning system having any suitable cleaning solution, e.g. nitric acid solution, known in the art may be used to degrease and clean the substrate material.

If desired, the substrate material may have a suitable flux, e.g. a rosin flux applied to it prior to coating. Any conventional fluxing system for applying any suitable flux known in the art may be used. For example, the substrate material may be dipped in and passed through a flux bath.

The tin-coated, copper alloy substrate composite of the instant invention has been found to have a wide variety of applications. One such application is as a lead frame 18 in an integrated circuit assembly 10 such as that shown in FIG. 1. The integrated circuit assembly 10 may have an integrated circuit chip 12 mounted on a metallic base 14. The chip 12 may be formed from any suitable semiconductive material such as silicon or germanium and may be mounted to the base 14 in any suitable manner such as by using an adhesive. A plurality of leads 16 from a lead frame 18 are electrically connected to the chip 12 by a plurality of lead wires 20.

Generally, the lead wires 20 are bonded to a plurality of metal or metal alloy pads 22 deposited on a surface 24 of the chip 12. The lead wires 20 may be bonded to the chip 12 and the leads 16 using any suitable conventional bonding technique such as soldering, thermosonic bonding, ultrasonic bonding, thermocompression bonding, etc. The chip 12, leads 16, base 14, and lead wires 20 typically are sealed within a package or casing 15.

The package or casing 15 may be formed from any suitable material or materials including plastics, glass, metal, metal alloys and/or ceramics. For example, the casing 15 may comprise sealing glass 26 bonded to the lead frame leads 16 and to the base 14 and a metal or metal alloy cover 28 bonded to the sealing glass.

The other end 30 of the lead frame may be connected to an external electrical connector or device such as a socket 32 in a board 34, a wire not shown, or any other electrical component. The bond or connection between the lead frame and the external electrical connector may be effected in any suitable manner such as by soldering. So that effective repairs may be made to these electrical connections after the assembly has been in service for an extended period of time, the material forming the lead frame should exhibit good solderability shelf life and low contact resistance.

It has been discovered that composites having a substrate 17 formed by the nickel-containing copper alloys described herein and at least partially coated with a layer 19 of tin or tin-containing material are particularly suitable for use as lead frame materials. Such composites exhibit improved solderability shelf life and relatively low contact resistance.

When used in lead frame applications, the composite forming the lead frame may have one or more of the substrate surfaces coated. The coating 19 may cover either the entire substrate surface or a portion or portions thereof. For example, the coating may be a stripe plated onto a surface of the substrate. The tin coating lends itself to making better and stronger connections between the lead frame and the external electrical connector.

Other uses for the composites of the instant invention include electrical connectors such as wires and tubular structures for heat exchangers and plumbing fixtures. When used to make tubular structures for heat exchangers or plumbing fixtures, the composites are also characterized by improved corrosion resistance. Any suitable fabrication technique known in the art may be used to form a desired article either before or after the tin coating has been applied.

The present invention and improvements resulting therefrom will be more readily understandable from a consideration of the following illustrative examples.

EXAMPLE I

A copper alloy consisting essentially of about 20% nickel and the balance essentially copper was prepared by melting 10 lb. charges of copper with the appropriate amount of nickel in an induction furnace and casting the melt to form a 1¾"×4"×4" ingot. The ingot was then hot rolled and cold rolled to a thickness of about 0.030" using conventional processing procedures.

Samples of 0.030" sheet were degreased, cleaned in a solution of 50% $HNO_3$ and electroplated in a commercial tin and lead fluoborate bath to a thickness of about $5\mu$. For comparison purpose, samples of commercially available copper alloy C26000 and nickel alloy 200 were also electroplated in a tin and lead fluoborate bath to a thickness of about $5\mu$.

Because the degradation of some of these materials requires long periods of time at room temperature, the tests were accelerated by aging the samples in air at 150° C. for various periods of time up to 360 hours. Aging accelerates the solderability degradation of specimens and allows comparisons to be made within a few days.

The exposed or aged samples were evaluated by dip soldering in a bath of 60% Sn and 40% Pb at 230° C. A non-aggressive rosin flux designated Alpha 100 was used prior to all dip tests. The solderability of the dipped samples was subjectively rated using the following system:

| Class | Description |
|---|---|
| I | Uniform Smooth Coating |
| II | Uniform Rough Coating |
|  | <1% Pinholes |
|  | <5% Dewetting |
| III | <50% Dewetting |
|  | <10% Pinholes |
| IV | >50% Dewetting |
|  | >10% Pinholes |
| V | No adhesion |

Figure 2:
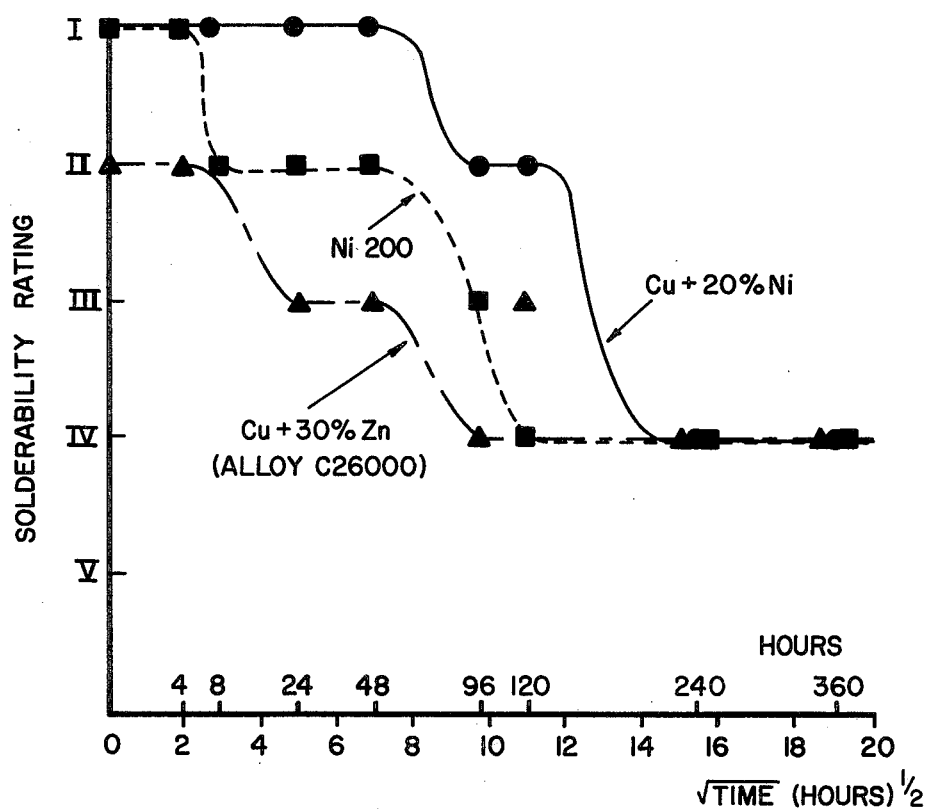
FIG. 2 is a graph showing the solderability rating of various materials electroplated with 5μ of 60% Sn-40% Pb solder as a function of aging time at 150° C.

As can be seen from FIG. 2, the plated copper base alloy containing about 20% nickel exhibited a slower rate of degradation than the plated copper alloy C26000 and the plated nickel alloy 200. Extrapolation of these results to room temperature suggest that the nickel-containing copper alloy electroplated with $5\mu$ of 60% Sn-40% Pb would have a lifetime of over 70 years. Alloy C26000 plated with $5\mu$ of 60% Sn-40% Pb would have a lifetime at room temperature of approximately 4 years.

EXAMPLE II

Samples of a copper base alloy consisting essentially of about 20% nickel and the balance essentially copper, commercially available copper alloys C26000 and C11000, and copper alloy C26000 plated with about $1.3\mu$ and about $2.5\mu$ of nickel were prepared. Nickel barrier layers of $1.3\mu$ and $2.5\mu$ are commonly used on copper alloy C26000 in the electronics industry to minimize the interdiffusion of substrate and coating.

Figure 3:
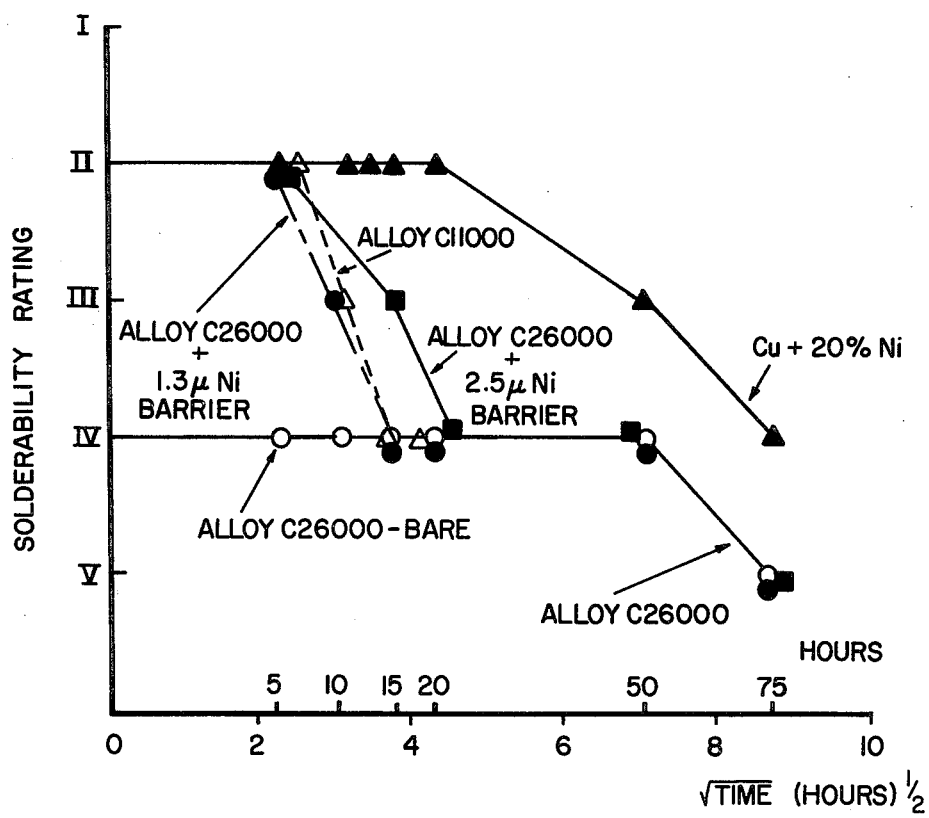
FIG. 3 is a graph showing the solderability rating of various materials electroplated with 2.5μ of 60% Sn-40% Pb solder as a function of aging time at 150° C.

All of the samples were electroplated with about $2.5\mu$ of 60% Sn-40% Pb solder, aged in air at 150° C. for various periods of time up to 75 hours and solder dip tested as described in Example I. As shown in FIG. 3, the copper base alloy containing about 20% nickel provides better accelerated shelf life solderability.

EXAMPLE III

The influence of nickel additions to copper were demonstrated by preparing copper-nickel alloys containing about 5%, 10%, 20% and 30% nickel. The alloys were prepared using the procedure described in Example I. The ingots were processed to 0.030" sheet. Samples from each sheet were electroplated with about $5\mu$ of 60% Sn-40% Pb solder, aged at 150° C. for times up to 96 hours and solder dip tested as described in Example I.

Figure 4:
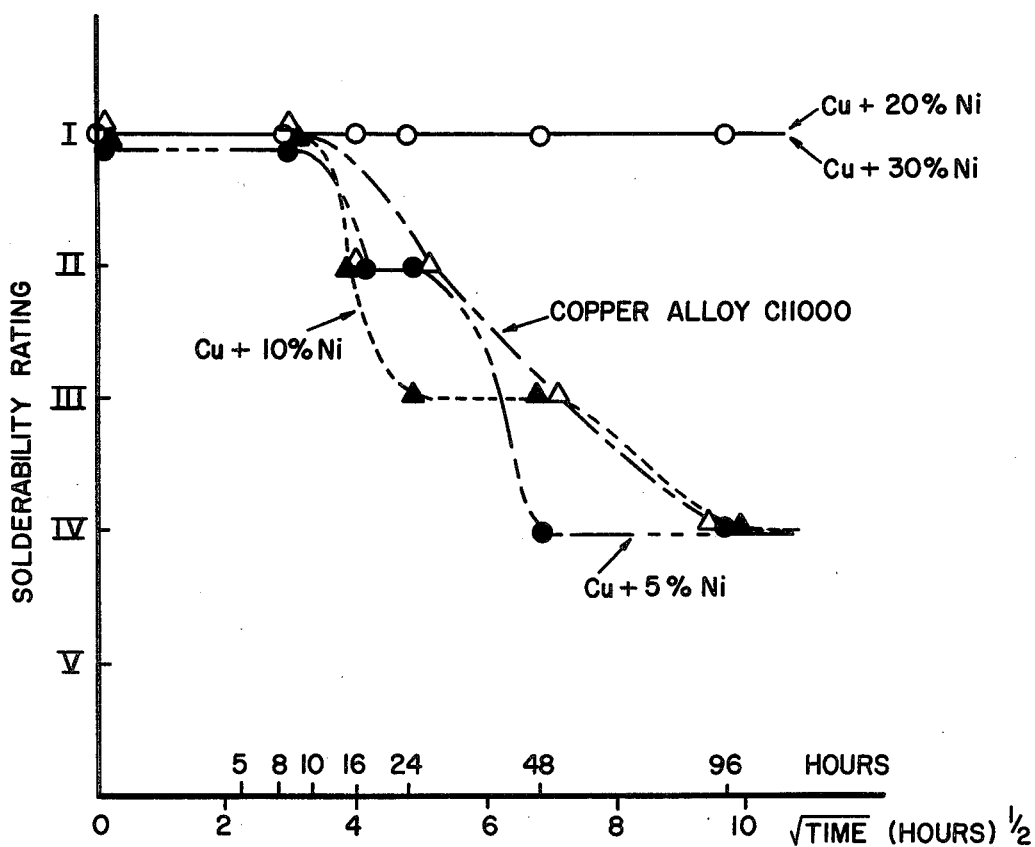
FIG. 4 is a graph showing the solderability rating of various copper alloys electroplated with 5μ of 60% Sn-40% Pb solder as a function of aging time at 150° C.

A sample of copper alloy C11000 was also electroplated with about $5\mu$ of 60% Sn-40% Pb solder, aged at 150° C. for a time up to 96 hours and solder dip tested as above for comparison purposes. FIG. 4 shows that a significant improvement in accelerated shelf life performance is observed as the nickel level increases.

EXAMPLE IV

A group of alloys were selected to provide a range of nickel levels from about 9.5% to about 30%. These alloys included alloys C70600, C71300, C71500, C72500 and two alloys designated Alloy A and Alloy B. For comparison purposes, alloys C19400, C63800 and C63810 were used as controls. The complete list of alloys and nominal compositions are summarized in Table I.

TABLE I

| Alloy | Nominal Composition (Wt %) | | | | | | | | | |
|---|---|---|---|---|---|---|---|---|---|---|
| | Ni | Fe | Zn | P | Mg | Si | Al | Co | Mn | Sn | Cu |
| C19400 | — | 2.4 | .12 | .03 | — | — | — | — | — | — | Bal. |
| C63800 | — | — | — | — | — | 1.8 | 2.8 | 0.4 | — | — | Bal. |
| C63810 | — | — | — | — | — | 2 | 3 | — | — | — | Bal. |
| C70600 | 10 | 1.4 | — | — | — | — | — | — | 1.0 | — | Bal. |
| C71300 | 25 | — | 1.0 | — | — | — | — | — | 1.0 | — | Bal. |
| C71500 | 30 | 0.5 | 1.0 | — | — | — | — | — | 1.0 | — | Bal. |
| C72500 | 9.5 | 0.6 | — | — | — | — | — | — | 0.2 | 2.3 | Bal. |
| Alloy A | 21 | 0.5 | 2.0 | .01 | .015 | — | — | — | 0.4 | — | Bal. |
| Alloy B | 21 | 0.5 | 0.2 | — | — | — | — | — | 0.4 | — | Bal. |

The alloy samples were cut into 1"×2" coupons, degreased in methyl alcohol and cleaned in 12% $H_2SO_4$ at 50° C. for 15 seconds, rinsed in water and immersed in a 60% Sn-40% Pb fluoborate commercial plating bath. A 60% Sn-40% Pb alloy was used as the anode. The coupons were plated with a nominal thickness of about 12µ of 60% Sn-40% Pb.

The electroplated coupons were cut into smaller sections and aged in air at 150° C. for 48 and 96 hours. The intermetallic thickness in the aged specimens was evaluated at a magnification of 1380X using a Bioquant Image Analysis System.

As summarized in Table II, the copper-tin intermetallic thickness formed on alloys A, B, C71300 and C71500 after aging at 150° C. for 48 and 96 hours was less than 1µ in thickness. In contrast, the intermetallic thickness on alloy C72500 was 8.0µ and 16.1µ after 48 and 96 hours exposure, respectively, and on alloy C70600 was 4.5µ and 9.6µ after 48 and 96 hours exposure. The rate of intermetallic formation on alloys C19400, C63800 and C63810 was below that on alloys C70600 and C72500 but clearly above the level on alloys A, B, C71300 and C71500.

TABLE II

| CU/SN INTERMETALLIC GROWTH | | |
|---|---|---|
| | Average Cu/Sn Intermetallic Thickness (µ) 150° C. Aging | |
| Alloy | 48 Hours | 96 Hours |
| C70600 | 4.5 | 9.6 |
| Alloy A | <1 | <1 |
| Alloy B | <1 | <1 |
| C71300 | <1 | <1 |
| C71500 | <1 | <1 |
| C72500 | 8.0 | 16.1 |
| C19400 | 2.6 | 3.2 |
| C63810 | 3.5 | 3.8 |
| C63800 | 2.9 | 3.5 |

EXAMPLE V

Samples of alloys C11000, C26000, C72500, C75200 and a copper alloy C were cut into 1"×2" coupons. The nominal compositions of these alloys are summarized in Table III. Alloys C11000, C26000, C72500 and C75200 are commercially available alloys. Alloy C was cast and processed as in Example I.

TABLE III

| Alloy | Nominal Composition (Wt %) | | | | | | |
|---|---|---|---|---|---|---|---|
| | Ni | Fe | Zn | Mn | Sn | $O_2$ | Cu |
| C11000 | — | — | — | — | — | .05 | Bal. |
| C26000 | — | — | 30 | — | — | — | Bal. |
| C72500 | 9.5 | 0.6 | — | 0.2 | 2.3 | — | Bal. |
| C75200 | 18 | — | 17 | — | — | — | Bal. |
| Alloy C | 20 | — | — | — | — | — | Bal. |

After cleaning, the coupons were immersed first in a flux and then in pure tin at 300° C. for five seconds. The coated coupons were allowed to cool to room temperature.

The hot-dip tinned coupons were cut into smaller sections and aged in air at 150° C. for times up to 240 hours. The intermetallic thickness in the aged specimens was measured as before.

Figure 5:
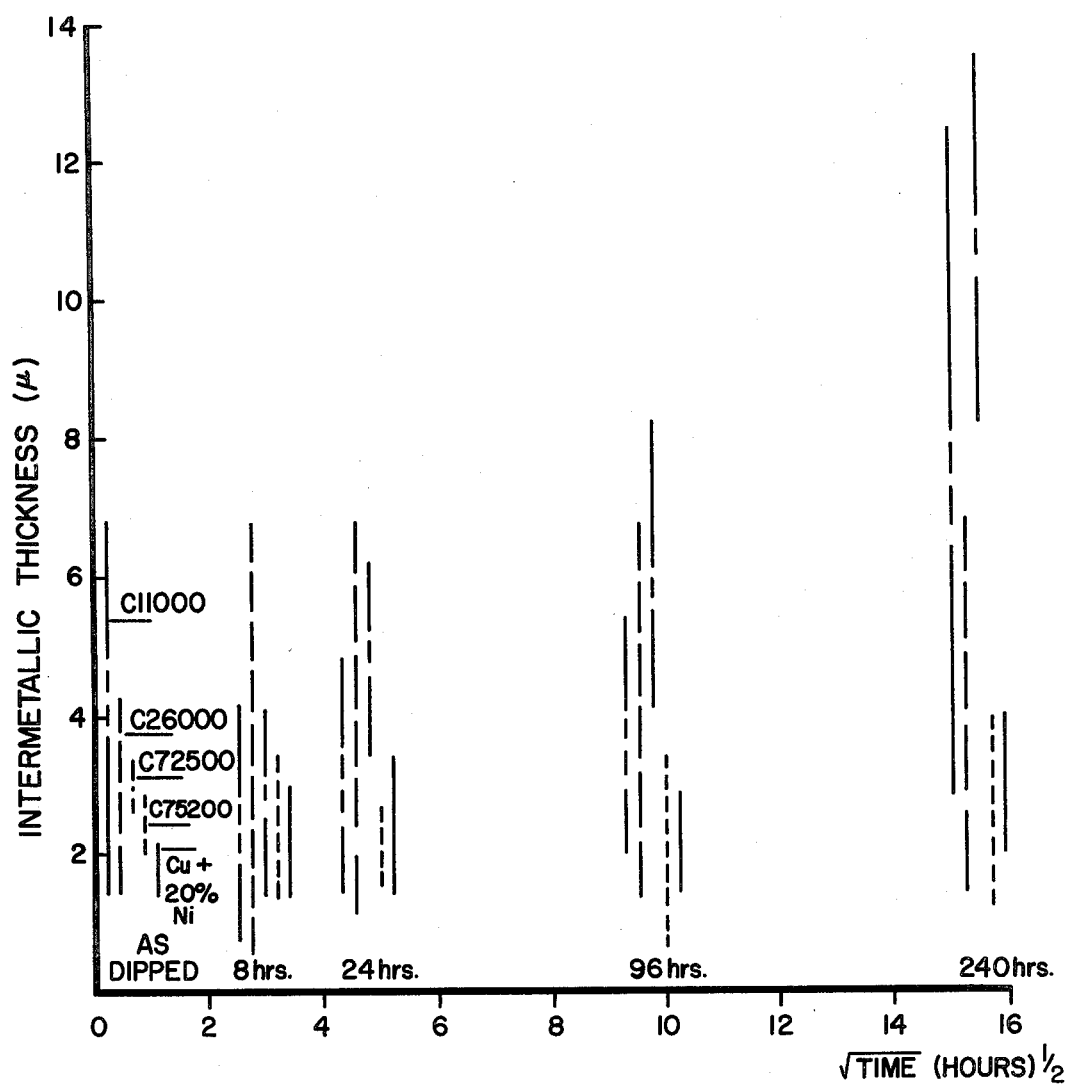
FIG. 5 is a graph showing maximum and minimum copper-tin intermetallic thickness as a function of aging time at 150° C. after hot-dip tinning.

As shown in FIG. 5, all of the tested alloys showed some intermetallic growth as a result of the hot tinning process. However, the thinnest intermetallic was found on the Cu-20% Ni binary alloy and on alloy C75200. FIG. 5 shows the minimum and maximum intermetallic thickness for each of the alloys as a function of time. It was interesting to note that the intermetallic layer on hot-dip tinned C72500 after aging at 150° C. for 240 hours was characterized by large islands or crystals of intermetallic protruding above the original tin coating surface. In contrast, the intermetallic on the Cu-20% Ni binary alloy was quite thin.

The above examples show the effect of nickel in the range of about 15% to about 30% in improving the solderability shelf life of tin or tin-containing material coated copper substrates and in reducing copper-tin and/or copper-zinc-tin intermetallic growth.

While the substrates have been described as being formed solely from the nickel-containing copper alloys described herein, they may also comprise a composite structure to be coated with tin or a tin-containing material. The composite may be either a biclad or a triclad. The nickel-containing copper alloy may be used as either the core or the cladding material. Preferably, the nickel-containing copper alloy forms that part of the composite to be coated and bonded to another article. The remainder of the composite may be formed from any suitable metal or metal alloy such as copper or copper alloys and iron or iron alloys, e.g. stainless steel.

The patents and articles set forth in the specification are intended to be incorporated by reference herein.

It is apparent that there has been provided in accordance with this invention copper alloys with improved solderability shelf life which fully satisfy the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications, and variations as fall within the spirit and broad scope of the appended claims.

What is claimed is:

1. A composite structure having a reduced growth of copper-tin intermetallic compounds, said composite structure comprising:

a substrate formed from a copper base alloy;

said copper base alloy consisting essentially of 19% to about 28% nickel and the balance essentially copper;

a coating covering at least a portion of said substrate;

said coating being formed from a tin-containing material; and said nickel in said alloy retarding the growth of said copper-tin intermetallic compounds and diffusion of said copper through said coating and thereby improving the solderability shelf life and contact resistance of said structure.

2. The composite structure of claim 1 further comprising:

said copper alloy consisting essentially of 19% to about 26% nickel and the balance essentially copper.

3. The composite structure of claim 1 wherein:

said copper alloy further includes up to about 25% zinc, whereby said nickel in said alloy retards the growth of copper-zinc-tin intermetallic compounds.

4. The composite structure of claim 1 further comprising:

said tin-containing material being selected from the group consisting of tin and tin alloys.

5. The composite structure of claim 1 wherein: said tin-containing material comprises a tin solder consisting essentially of about 40% lead and the balance essentially tin.

6. The composite structure of claim 1 further comprising:

said coating comprising a stripe of said tin-containing material plated on at least one surface of said substrate.

7. The composite structure of claim 1 wherein:

said substrate comprises a composite having a core and a cladding material; and said copper base alloy forming one of said core and said cladding material.

8. An integrated circuit assembly for electrical applications, said assembly comprising:

a lead frame formed from a composite structure;

said composite structure having a substrate formed from a copper alloy consisting essentially of 19% to about 28% nickel and the balance essentially copper and a coating covering at least a portion of said substrate;

said coating being formed from a tin-containing material; and said nickel in said alloy retarding the growth of copper-tin intermetallic compounds and diffusion of said copper through said coating.

9. The integrated circuit assembly of claim 8 further comprising:

at least one electrical connector;

said lead frame being bonded to said at least one electrical connector; and said bond between said lead frame and each said electrical connector being effected at said coated portion.

10. The integrated circuit assembly of claim 9 further comprising:

a semiconductor chip; and said lead frame being connected to said chip by at least one lead wire.

11. The integrated circuit assembly of claim 8 wherein said coating comprises:

a stripe of said tin-containing material plated on a surface of said substrate.

12. The integrated circuit assembly of claim 8 wherein:

said copper alloy consists essentially of 19% to about 26% nickel and the balance essentially copper.

13. The integrated circuit assembly of claim 8 wherein:

said copper alloy further includes up to about 25% zinc.

14. The integrated circuit assembly of claim 8 further comprising:

said tin-containing material being selected from the group consisting of tin and tin alloys.

15. The integrated circuit assembly of claim 8 further comprising:

said tin-containing material comprising a tin solder consisting essentially of about 40% lead and the balance essentially tin.

* * * * *